(12) United States Patent
Taniuchi

(10) Patent No.: US 10,360,990 B2
(45) Date of Patent: Jul. 23, 2019

(54) INFORMATION PROCESSING DEVICE, INFORMATION PROCESSING METHOD, AND PROGRAM

(71) Applicant: NEC Corporation, Tokyo (JP)

(72) Inventor: Noriyuki Taniuchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 141 days.

(21) Appl. No.: 15/448,616

(22) Filed: Mar. 3, 2017

(65) Prior Publication Data

US 2017/0256323 A1    Sep. 7, 2017

(30) Foreign Application Priority Data

Mar. 3, 2016    (JP) .................. 2016-041452

(51) Int. Cl.
| | | |
|---|---|---|
| *G06F 11/22* | (2006.01) | |
| *G11C 29/08* | (2006.01) | |
| *G06F 11/14* | (2006.01) | |
| *G06F 9/4401* | (2018.01) | |
| *G11C 29/04* | (2006.01) | |
| *G11C 29/00* | (2006.01) | |

(52) U.S. Cl.
CPC ............ *G11C 29/08* (2013.01); *G06F 9/4406* (2013.01); *G06F 11/1417* (2013.01); *G06F 11/2284* (2013.01); *G11C 29/70* (2013.01); *G11C 2029/0407* (2013.01)

(58) Field of Classification Search
CPC . G06F 11/1417; G06F 11/2284; G06F 9/4406
USPC .......................................................... 714/36
See application file for complete search history.

(56) References Cited

U.S. PATENT DOCUMENTS

| | | | |
|---|---|---|---|
| 9,128,835 B2 * | 9/2015 | Cadima .................. | G07F 17/32 |
| 2010/0042629 A1 * | 2/2010 | Fukatani ............. | G06F 11/2289 709/212 |
| 2015/0160950 A1 * | 6/2015 | Wang .................. | G06F 11/1417 713/2 |

FOREIGN PATENT DOCUMENTS

| | | | | |
|---|---|---|---|---|
| JP | 2000-293391 | | 10/2000 | |
| JP | 2009277223 | A * | 11/2009 | ........... G06F 9/4406 |
| JP | 5363187 | | 12/2013 | |

* cited by examiner

*Primary Examiner* — Chae M Ko

(74) *Attorney, Agent, or Firm* — Young & Thompson

(57) ABSTRACT

A startup check unit configured to check for a predetermined range of memory area is included. An operating system is started by using the memory area checked by the startup check unit. The operating system has a memory check unit configured to check for a memory area other than the memory area checked by the startup check unit, and an application startup unit configured to start an application depending on a memory amount indicating an amount of the memory area checked by the memory check unit.

9 Claims, 13 Drawing Sheets

Fig.2

Table 32:

| MEMORY AREA | NUMA NODE | CHECK SUBJECT | CHECK STATUS ATTRIBUTE |
|---|---|---|---|
| 0x00000000-0x0000ffff | NODE 0 | FW | CHECKED(NORMAL) |
| 0x00010000-0x0001ffff | NODE 0 | - | UNCHECKED |
| ⋮ | ⋮ | ⋮ | ⋮ |
| 0x10000000-0x1000efff | NODE 1 | FW | CHECKED(NORMAL) |
| 0x1000f000-0x1000ffff | NODE 1 | FW | CHECKED(FAULT) |
| 0x10010000-0x1001ffff | NODE 1 | - | UNCHECKED |
| ⋮ | ⋮ | ⋮ | ⋮ |

Fig.3

Table 54:

| MEMORY AREA | NUMA NODE | STATE | CHECK STATUS ATTRIBUTE |
|---|---|---|---|
| 0x00000000-0x0000ffff | NODE 0 | VALID | FW CHECKED(NORMAL) |
| 0x00010000-0x0001ffff | NODE 0 | INVALID | FW CHECKED(FAULT) |
| 0x00020000-0x0002ffff | NODE 0 | VALID | OS CHECKED(NORMAL) |
| 0x00030000-0x0003ffff | NODE 0 | INVALID | UNCHECKED |
| ⋮ | ⋮ | ⋮ | ⋮ |
| 0x10000000-0x1001ffff | NODE 1 | VALID | FW CHECKED(NORMAL) |
| 0x10020000-0x1002ffff | NODE 1 | INVALID | OS CHECKED(FAULT) |
| 0x10030000-0x1003ffff | NODE 1 | INVALID | OS CHECKING |
| 0x10040000-0x1fffffff | NODE 1 | INVALID | UNCHECKED |
| ⋮ | ⋮ | ⋮ | ⋮ |

Fig.4

| STARTUP ORDER | APPLICATION | NUMA NODE | REQUIRED MEMORY AMOUNT | DEPENDENCY |
|---|---|---|---|---|
| 1 | NETWORK SERVICE | NOT DESIGNATED | 30MB | NONE |
| 2 | CLUSTERWARE SERVICE | NOT DESIGNATED | 30MB | AFTER NETWORK SERVICE STARTED |
| 3 | SHARED MEMORY | NODE 0 | 100GB | NONE |
| 3 | SHARED MEMORY | NODE 1 | 100GB | NONE |
| 4 | DATABASE SERVICE | NODE 0 | 10GB | AFTER SHARED MEMORY ALLOCATED |
| 4 | DATABASE SERVICE | NODE 1 | 10GB | AFTER SHARED MEMORY ALLOCATED |
| 5 | WEB SERVICE | NODE 0 | 30GB | AFTER NETWORK SERVICE STARTED AFTER DATABASE SERVICE STARTED |
| 5 | WEB SERVICE | NODE 1 | 30GB | AFTER NETWORK SERVICE STARTED AFTER DATABASE SERVICE STARTED |
| 6 | BUSINESS MONITORING SERVICE | NOT DESIGNATED | 100MB | AFTER ALL BUSINESS APS STARTED |
| ⋮ | ⋮ | ⋮ | ⋮ | ⋮ |
| 10 | SPARE MEMORY | NOT DESIGNATED | 500GB | NONE |

Fig.5
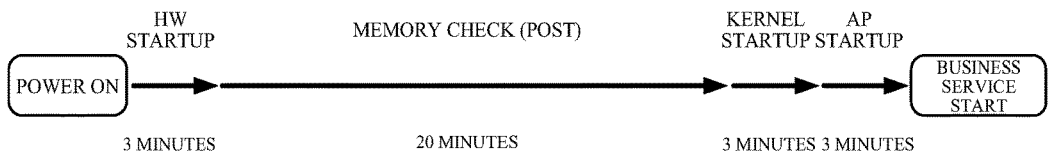
· IN CASE OF STARTING KERNEL AFTER COMPLETION OF MEMORY CHECK (POST)
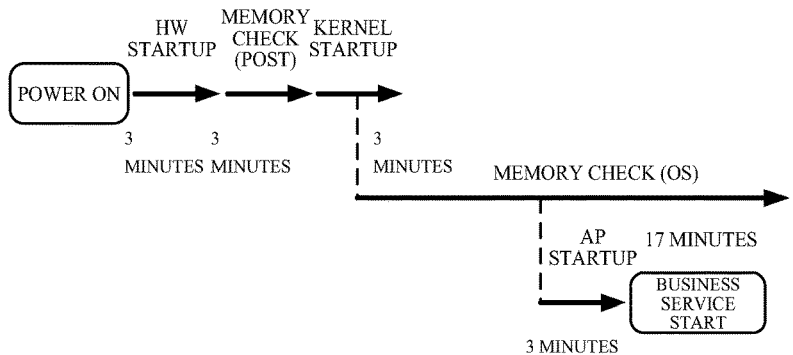
· THE PRESENT INVENTION
Fig.6
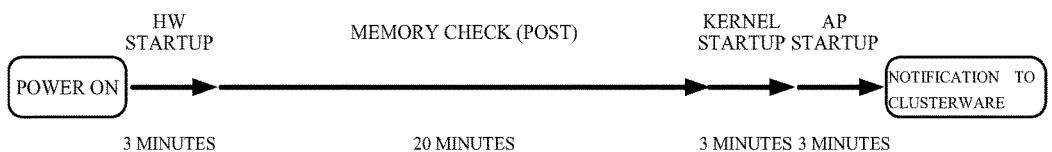
· IN CASE OF STARTING KERNEL AFTER COMPLETION OF MEMORY CHECK (POST)
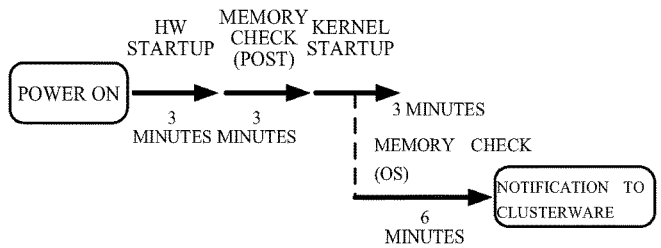
· THE PRESENT INVENTION

Fig. 13

| APPLICATION | RECOVERY PROCEDURE | DEPENDENCY | AVAILABLE MEMORY RANGE |
|---|---|---|---|
| NETWORK SERVICE | NONE | NONE | NONE |
| CLUSTERWARE SERVICE | NONE | AFTER NETWORK STARTUP | NONE |
| SHARED MEMORY | REGISTER PHYSICAL ADDRESS WHERE DATA IS STORED AS SUPPLY MEMORY TO KERNEL | NONE | DATA-DEDICATED NON-VOLATILE MEMORY 0x40000000–0x5fffffff |
|  | RECOVER CORRUPTION OF FIXED DATA BY RELOADING ORIGINAL DATA |  |  |
|  | DETECT/RECOVER DATA IN PROGRESS |  |  |
| DATABASE SERVICE | ROLLBACK OF DATA IN PROGRESS | AFTER SHARED MEMORY ALLOCATION | DATA-DEDICATED NON-VOLATILE MEMORY 0x40000000–0x5fffffff |
| WEB SERVICE | DELETE REMAINING TEMPORAL DATA/ CACHE | NONE | DATA-DEDICATED NON-VOLATILE MEMORY 0x60000000–0x6fffffff |
|  | RELOAD DATA FILE (PREFETCH AS CACHE) |  |  |
| BUSINESS MONITORING SERVICE | DELETE REMAINING TEMPORAL DATA/ CACHE | NONE | NONE |
| ... |  |  |  |
| EXCESS MEMORY | NONE |  | NONE |

88

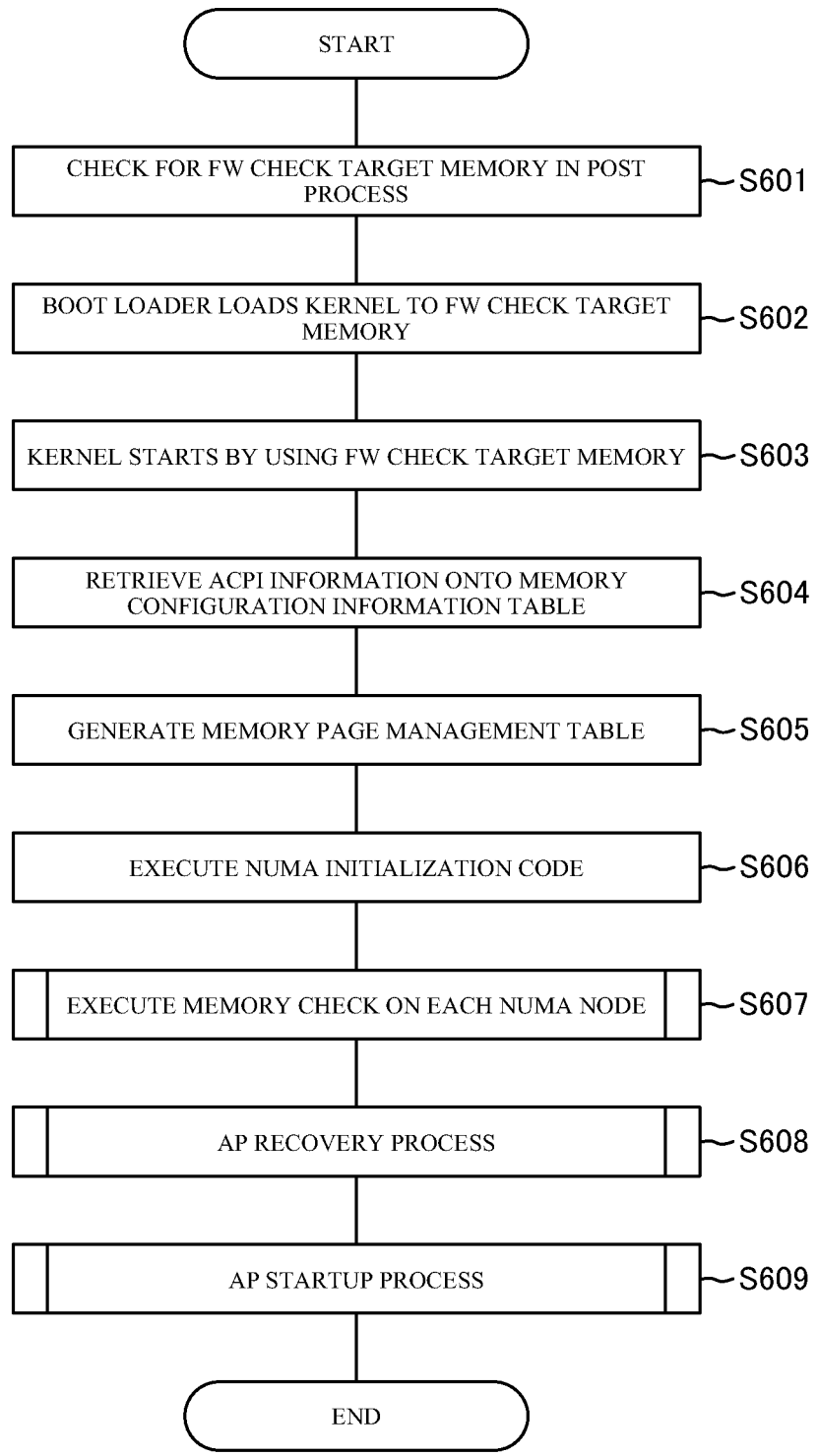

INFORMATION PROCESSING DEVICE, INFORMATION PROCESSING METHOD, AND PROGRAM

INCORPORATION BY REFERENCE

This application is based upon and claims the benefit of priority from Japanese patent application No. 2016-041452, filed on Mar. 3, 2016, the disclosure of which is incorporated herein in its entirety by reference.

TECHNICAL FIELD

The present invention relates to an information processing device, an information processing method, and a program. Specifically, the present invention relates to an information processing device having a large-scale memory, an information processing method, and a program.

BACKGROUND ART

In an information processing device such as a server device, after it is powered on, a firmware executes memory check during a process called POST (Power On Self Test). After the check by the firmware, an OS (Operating System) startup process is executed.

If a broken memory is accessed during the OS startup process before a function to disconnect part of memory, and the like, is enabled, the device is brought to an uncontrollable state and there is no choice but to abnormally end. Therefore, in the startup process, it is required to secure reliability by checking for the memory before starting the OS.

Because the startup process is executed in the manner as described above, the OS cannot be started while the firmware mechanically checks all the memory ranges. This results in occurring of a problem that a waiting time gets longer as the capacity of the memory becomes larger. Thus, various techniques to cope with the problem that a waiting time gets longer are considered.

For example, one of the techniques as described above is disclosed in Patent Document 1. According to Patent Document 1, a memory area is divided into two and a first memory area is checked by the firmware. Then, the OS is started with only the checked memory area. Moreover, according to Patent Document 1, a second memory area is checked by the firmware in parallel with the OS startup process, completion of the check is notified to the OS with SMI (System Management Interrupts). In response to the SMI, the checked memory is hotplugged so as to be available by the OS. According to Patent Document 1, such a process allows parallel execution of memory check and OS initialization and allows increase of the startup speed.

Further, another example of the technique is disclosed in Patent Document 2. According to Patent Document 2, at the time of system startup before the operating system is loaded to the memory, a minimum memory area required for startup of the operating system is checked. Moreover, according to Patent Document 2, after the operating system is executed, access to the memory is detected, and it is determined whether or not memory check has already been done for each page before an accessed memory page is used. If memory check has not been done, memory check is done and a checked memory page is used. According to Patent Document 2, this configuration makes it possible to shorten a startup time when the system of a large-scale memory system is started.

Patent Document 1: Japanese Patent Publication No. JP5363187
Patent Document 2: Japanese Unexamined Patent Application Publication No. JP-A 2000-293391

In the technique disclosed in Patent Document 1, OS initialization may end earlier than memory check depending on the capacity of the memory. In this case, the OS cannot start an application requiring the second memory area until SMI is used. Consequently, there is a risk that this technique does not make startup of an application faster. Moreover, in the technique disclosed in Patent Document 2, there is a need to determine for each access to the memory whether or not the memory has already been accessed, and a process to access the memory is complicated. This causes a problem such as there is a risk that application processing becomes slow.

Thus, various techniques for solving the waiting time problem have been considered, but it has still been difficult to speedily start an information processing device such as a server device and speedily execute an application without delay.

SUMMARY OF THE INVENTION

Accordingly, an object of the present invention is to provide an information processing device which solves a problem of difficulty to speedily execute an application in an information processing device such as a server device.

In order to achieve the object, an information processing device as an aspect of the present invention has a startup check unit configured to check for a predetermined range of memory area, and starts an operating system by using the memory area checked by the startup check unit.

The operating system has a memory check unit configured to check for a memory area other than the memory area checked by the startup check unit, and an application startup unit configured to start an application depending on a memory amount indicating an amount of the memory area checked by the memory check unit.

Further, an information processing method as another aspect of the present invention includes:
checking for a predetermined range of memory area; and
starting an operating system by using the checked memory area.

The operating system is configured to check for a memory area other than the checked memory area of a whole memory area, and start an application depending on a memory amount indicating an amount of the checked memory area.

Further, a program as another aspect of the present invention is a program comprising instructions for:
causing an information processing device to realize a startup check unit configured to check for a predetermined range of memory area;
causing the information processing device to start an operating system by using the memory area checked by the startup check unit; and
causing the operating system to realize a memory check unit configured to check for a memory area other than the memory area checked by the startup check unit of a whole memory area, and an application startup unit configured to start an application depending on a memory amount indicating an amount of the memory area checked by the memory check unit.

With the configuration of the present invention as described above, it is possible to provide an information processing device which solves the problem of difficulty to speedily execute an application in an information processing device such as a server device.

BRIEF DESCRIPTION OF DRAWINGS

FIG. 2 is a diagram showing an example of ACPI information shown in FIG. 1;

FIG. 3 is a diagram showing an example of a memory page management table shown in FIG. 1;

FIG. 4 is a diagram showing an example of an AP startup condition table shown in FIG. 1;

FIG. 5 is a diagram for describing a difference between the server device according to the first exemplary embodiment of the present invention and a case of starting a kernel after memory check completion;

FIG. 6 is a diagram for describing a difference between the server device according to the first exemplary embodiment of the present invention and the case of starting the kernel after memory check completion;

FIG. 13 is a diagram showing an example of an AP recovery procedure table shown in FIG. 12;

FIG. 14 is a flowchart showing an example of a process to start the server device according to the second exemplary embodiment of the present invention;

EXEMPLARY EMBODIMENT

First Exemplary Embodiment

Figure 1:
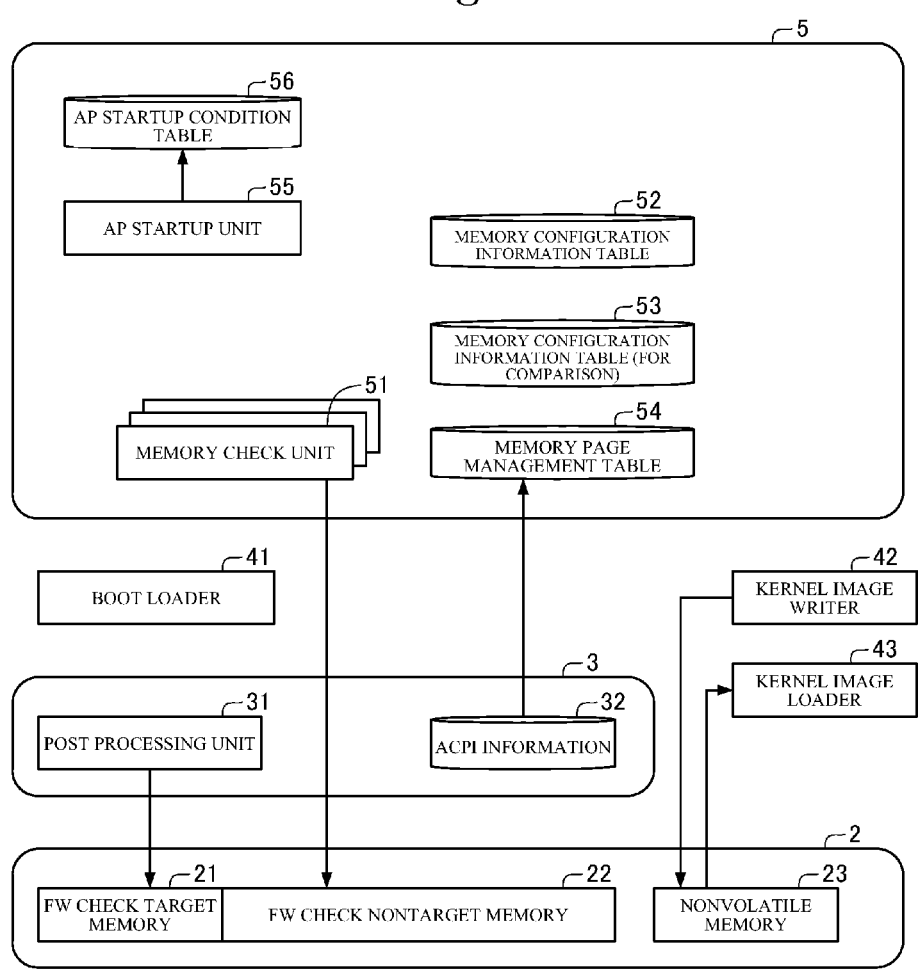
FIG. 1 is a block diagram showing an example of the configuration of a server device according to a first exemplary embodiment of the present invention.
Figure 7:
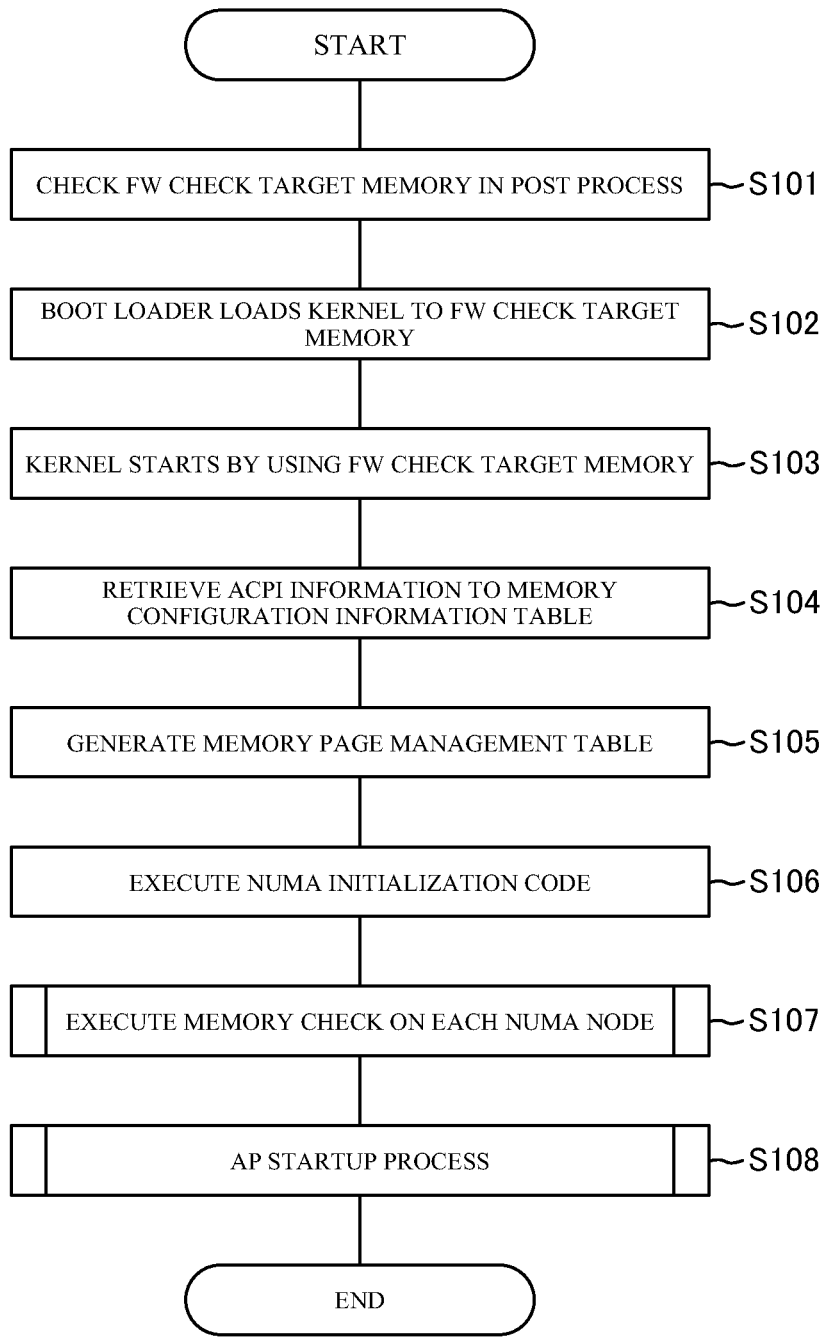
FIG. 7 is a flowchart showing an example of a flow until startup is complete after the server device is powered on according to the first exemplary embodiment of the present invention.
Figure 8:
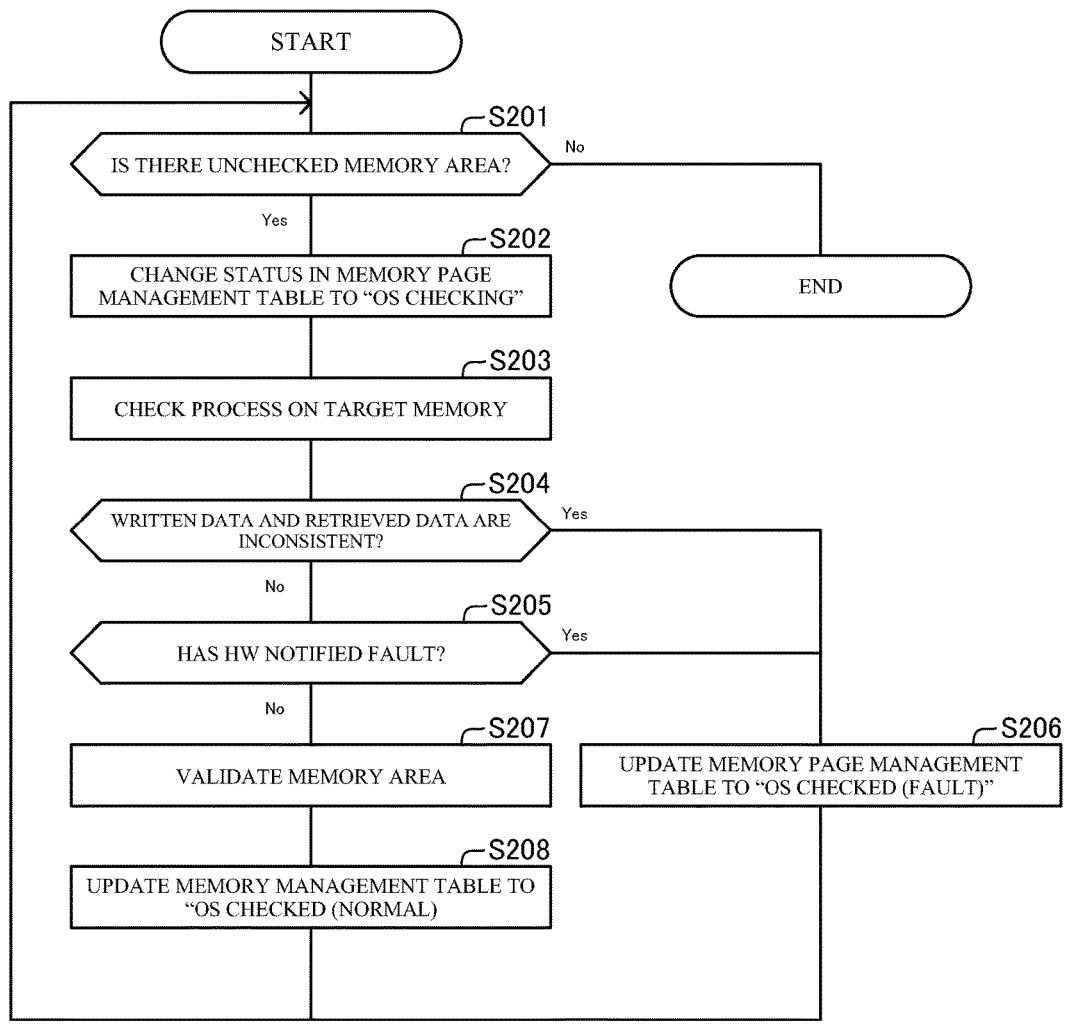
FIG. 8 is a flowchart showing an example of memory check executed by the server device shown in FIG. 7.
Figure 9:
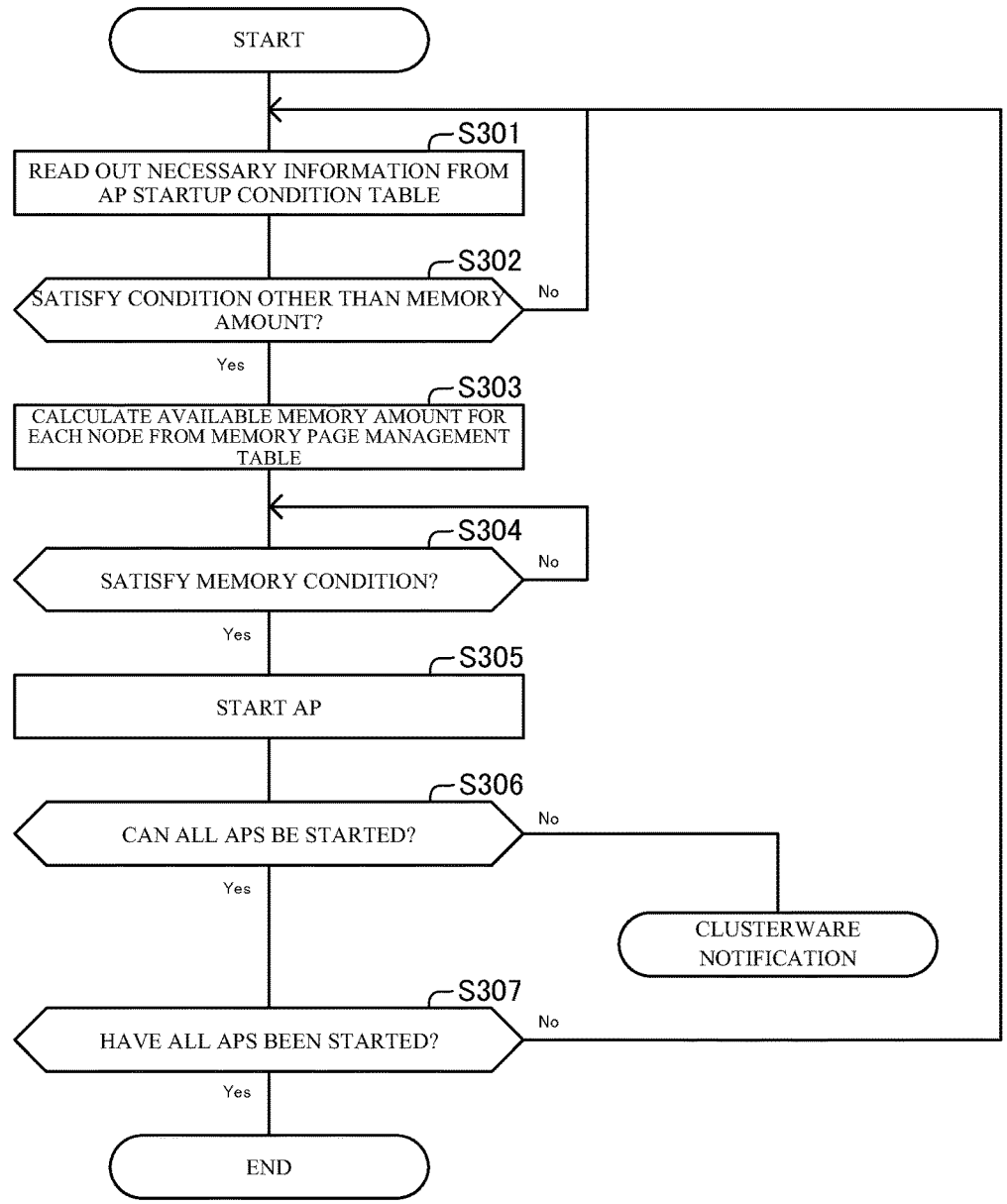
FIG. 9 is a flowchart showing an example of an AP startup process shown in FIG. 7.
Figure 10:
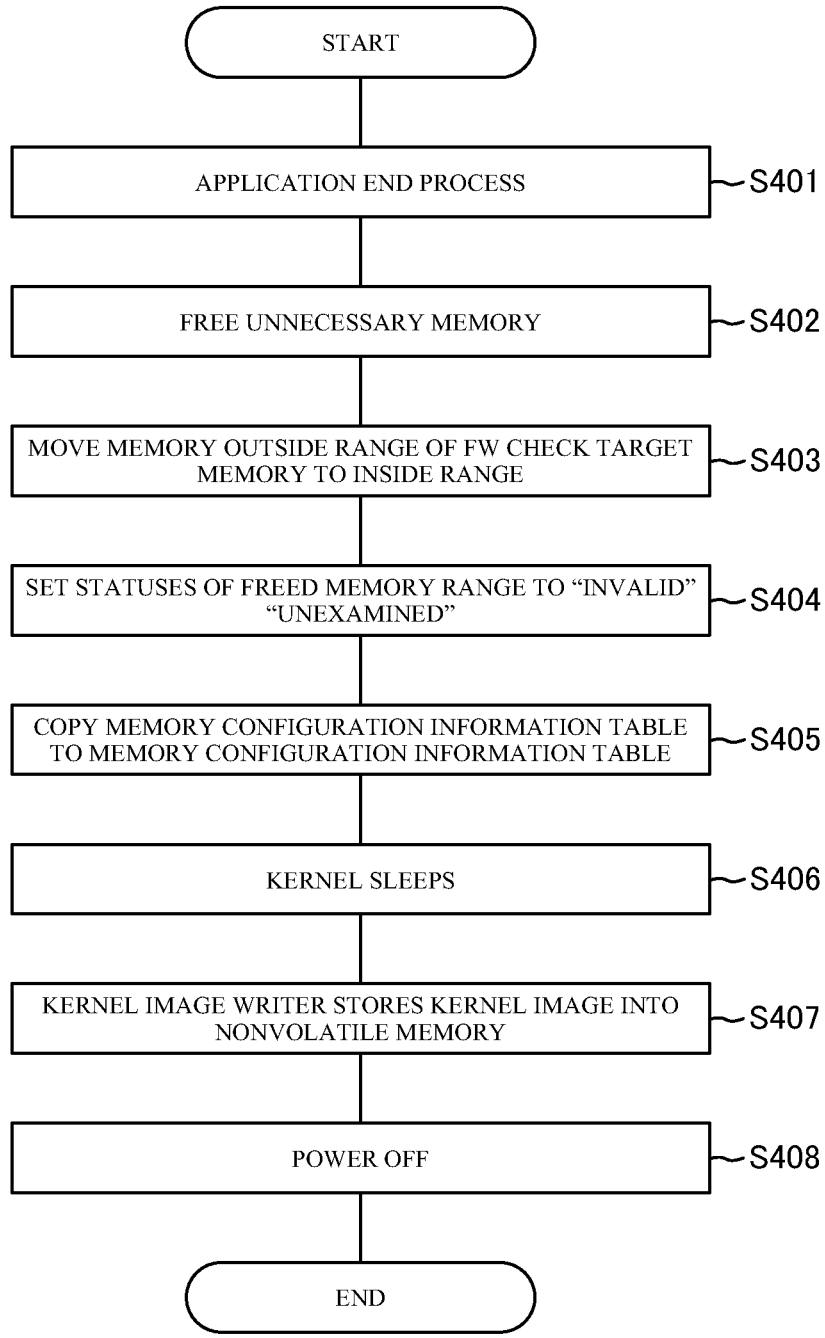
FIG. 10 is a flowchart showing an example of a process to stop the server device according to the first exemplary embodiment of the present invention.
Figure 11:
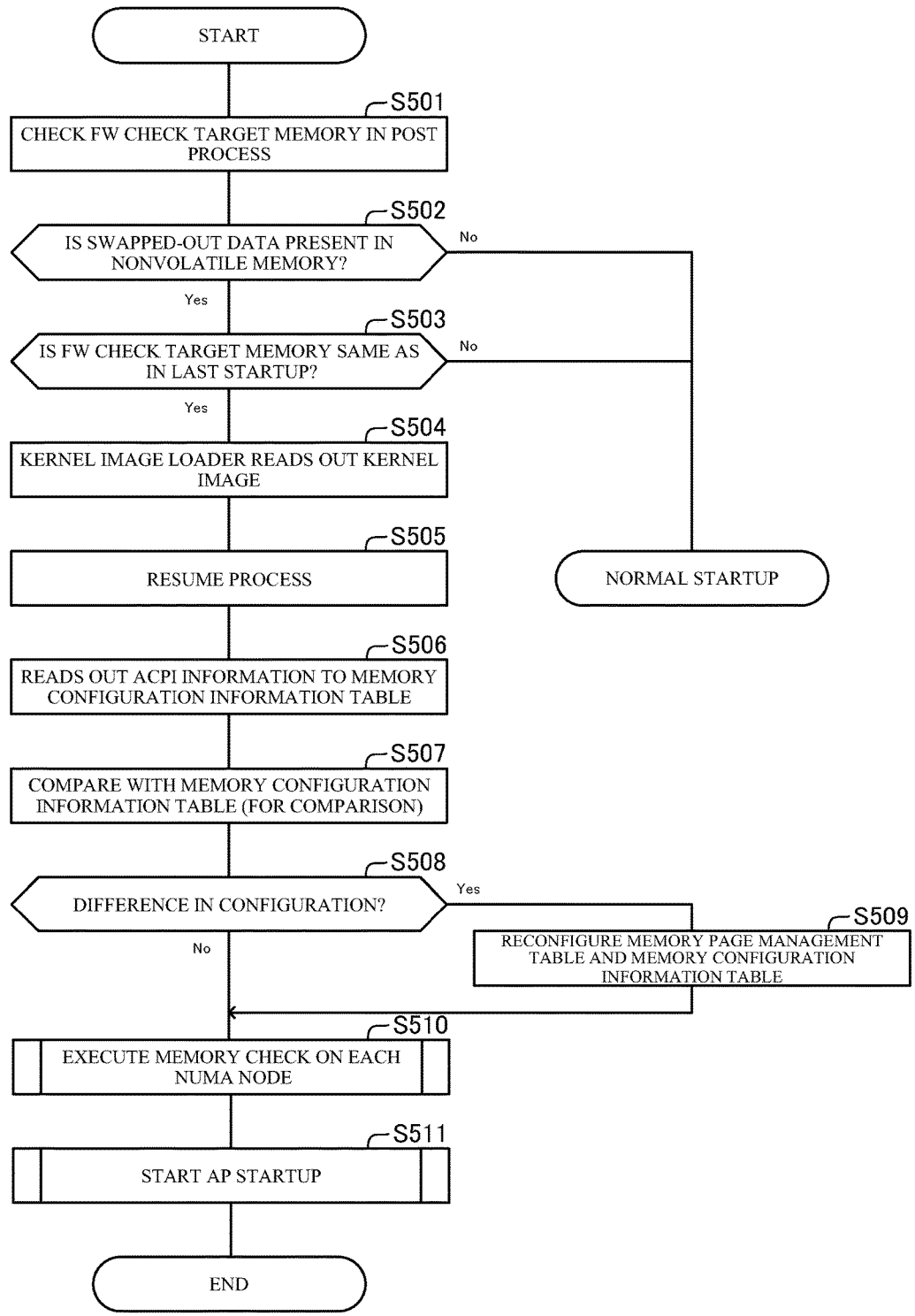
FIG. 11 is a flowchart showing an example of a process to start the server device for a second time or more according to the first exemplary embodiment of the present invention.

A first exemplary embodiment of the present invention will be described with reference to FIGS. 1 to 11. FIG. 1 is a block diagram showing an example of the configuration of a server device 1. FIG. 2 is a diagram showing an example of ACPI information 32. FIG. 3 is a diagram showing an example of a memory page management table 54. FIG. 4 is a diagram showing an example of an AP startup condition table 56. FIGS. 5 and 6 are diagrams for describing a difference between the server device 1 and a case of starting a kernel after memory check is complete. FIG. 7 is a flowchart showing an example of a flow until startup is complete after the server device 1 is powered on. FIG. 8 is a flowchart showing an example of memory check executed by the server device 1. FIG. 9 is a flowchart showing an example of an AP startup process executed by the server device 1. FIG. 10 is a flowchart showing an example of a process to stop the server device 1. FIG. 11 is a flowchart showing an example of a process to start the server device 1 for a second time or more.

In the first exemplary embodiment of the present invention, an example of the configuration of the server device 1 which starts an OS after checking for memory. As described later, a FW 3 (Firmware) of the server device 1 in this exemplary embodiment checks for a FW check target memory 21, which is a predetermined range of memory area. Then, the server device 1 starts an OS 5 by using the FW check target memory 21. Moreover, the OS 5 of the server device 1 checks for a FW check nontarget memory 22. Then, the OS 5 starts an application (AP) in accordance with the progress of the check on the FW check nontarget memory 22.

Referring to FIG. 1, the server device 1 in this exemplary embodiment includes a HW 2 (Hardware), the FW 3, a boot loader 41, a kernel image writer 42, a kernel image loader 43, and the OS 5.

As shown in FIG. 1, the HW 2 includes the FW check target memory 21 (a predetermined range of memory area), the FW check nontarget memory 22, and a nonvolatile memory 23 (another storage device). The HW 2 is controlled by the FW 3 while the server device is powered on and the OS 5 starts. Moreover, the HW 2 is controlled by the OS 5 after the OS 5 starts.

The boundary between the FW check target memory 21 and the FW check nontarget memory 22 of memory of the HW 2 is previously determined depending on whether or not the FW 3 checks. For example, the range of the FW check target memory 21 is previously determined so that the amount of memory needed to start the OS 5 can be secured.

To be specific, for example, the FW check target memory 21 is for one set of memory module allocated to the lowest address range, and a range excluding the FW check target memory 21 of a volatile memory of the HW 2 is the FW check nontarget memory 22. In general, important data such as a kernel program is usually located in a lower address. Therefore, by defining the FW check target memory 21 as described above, it is possible to make a range to locate important data to be the target of a check by the FW 3.

Further, for example, in the case of a device having a NUMA (Non-Uniform Memory Access) architecture, which is an architecture that an access distance from a processor to a memory is non-uniform, it can also be considered to make a range corresponding to a lower address of a memory belonging to each NUMA node to be the FW check target memory 21. This is because it is preferable in view of performance and efficiency to store management information of each NUMA node into a memory area belonging to the NUMA node and it leads to simplification of the initialization process that it is possible to use a memory of each NUMA node immediately after reading a memory configuration from the firmware.

Thus, the range of the FW check target memory 21 checked by the FW 3 is previously defined. Herein, it is desirable to set the range of the FW check target memory 21 so as to be sufficiently small with respect to the sum of the FW check target memory 21 and the FW check nontarget memory 22. Besides, the position and size of the FW check target memory 21 may be changed, for example, in accordance with the characteristic of the HW 2, the type of the OS 5 (for example, the amount of memory used by the OS 5) supported by the HW 2, and so on. In other words, the position and size of the FW check target memory 21 can be properly determined by the firmware designer on the basis of the specifications and implementation of the OS 5 supported by the HW 2, and the like.

The nonvolatile memory 23 is used for saving an execution memory image of the OS 5 (an execution image of the kernel). Using the execution image of the kernel stored in the nonvolatile memory 23 makes it possible to shorten a time to start for a second time or more as described later.

Although the HW 2 has the nonvolatile memory 23 in FIG. 1, the nonvolatile memory 23 is not necessarily in the HW 2. The nonvolatile memory 23 may be a storage device which is connected outside, or a detachable storage device.

The FW 3 includes a POST processing unit 31 (a startup check unit) which checks for the HW 2 before starting the OS 5, and ACPI (Advanced Configuration and Power Interface) information 32 which becomes an information source for notifying the configuration of the HW 2 to the OS 2. The FW 3 is stored in a storage device such as a ROM (Read Only Memory) and a flash memory and installed in the HW 2, and controls the HW 2.

The POST processing unit 31 checks whether or not there is a fault in a device on the HW 2 including the FW check target memory 21, which is a predetermined range of memory area. Then, the POST processing unit 31 updates the ACPI information 32 on the basis of the check result.

A process executed in a case where the POST processing unit 31 finds a fault as a result of a check on the FW check target memory 21 can be changed depending on whether or not to start the server device 1 by using the nonvolatile memory 23. For example, the server device may be configured so that, in the case of not using the nonvolatile memory 23 (for example, in the case of first startup), the POST processing unit 31 disables a part where a fault is found and does not execute a new check, or additionally executes a check on another memory area. The process executed by the POST processing unit 31 when detecting a fault in the case of not using the nonvolatile memory 23 can be changed in accordance with a condition (the minimum amount of memory, or the like) for startup of the OS 5 supported by the HW 2.

On the other hand, in the case of using the execution image of the kernel stored in the nonvolatile memory 23 (for example, in the case of second startup or more), it is impossible to simply change the address range. This is because when a memory corresponding to an address referred to by the execution image of the kernel stored in the nonvolatile memory 23 is lost, the kernel cannot normally run after swapped in the FW check target memory 21. Therefore, in the case of using the execution image of the kernel stored in the nonvolatile memory 23, the POST processing unit 31 does not execute a new check. Moreover, in a case where the memory of the corresponding range is lost, for example, the execution image of the kernel is not used even when it is second startup or more. Meanwhile, the server device may be configured so that the POST processing unit executes a new range if change of the address range can be hidden by a function of the hardware.

In order to avoid a situation that, at the time of second startup or more, the execution image of the kernel is discarded and usual startup is done, it is effective to duplicate the memory. In a case where the memory is duplicated, when one of a memory module as a duplication pair is disabled even if the memory falls back due to a fault, the address range is the same as the previous one. Therefore, the OS 5 can be normally started. By using Memory Address Range Mirroring, which is a technique to duplicate only a partial memory range, it is possible to duplicate only the memory range of the FW check target memory 21.

The ACPI information 32 has information showing the ranges of the FW check target memory 21 and the FW check nontarget memory 22 (information which range the POST processing unit 31 checks for) in addition to conventional hardware configuration. The ACPI information 32 is updated by the POST processing unit 31, for example. Moreover, the ACPI information 32 provides information included thereby in accordance with a request by the OS 5.

FIG. 2 shows an example of the information included by the ACPI information 32. Referring to FIG. 2, the ACPI information 32 includes Memory area, NUMA Node representing which NUMA node an address range shown by Memory area belongs to, Check Subject representing whether or not the POST processing unit of the FW 3 checks Memory area, and Check Status Attribute representing whether or not the address range shown by Memory area has already been checked. For example, the first row of FIG. 2 shows that Memory area "0x00000000-0x0000ffff," NUMA Node "node 0," Check Subject "FW," and Check Status Attribute "checked (normal)" are associated. In other words, the first row of FIG. 2 shows that Memory area "0x00000000-0x0000ffff" belongs to the node 0 and is an area which the FW 3 checks for (the FW check memory 21), and the address range has been checked and no fault has been detected (normal).

The item NUMA Node of the ACPI information 32 (that is, which NUMA node a physical memory address belongs to) is an item managed by the firmware from before in a case where a hardware configuration is the NUMA architecture. Moreover, Check Subject and Check Status Attribute are items newly added to the ACPI information 32 in the present invention. For example, Memory area where Check Subject is FW is checked by the POST processing unit 31, and Memory area where Check Subject is not FW is checked by a memory check unit 51 of the OS 5 to be described later. Moreover, Check Status Attribute of the ACPI information 32 shows, for example, any of "checked (normal)" representing that a check has already been done and there is no fault, "checked (fault)" representing that a check has already been done and a fault has been detected, and "unchecked" representing that a check has not been done.

The ACPI information 32 includes such information, for example. Thus, the ACPI information 32 in this exemplary embodiment includes not only information of an already checked range but also a range before checked. In other words, the ACPI information 32 includes information showing what amount of memory is present in total. Therefore, the OS 5 receiving the ACPI information 32, when a memory check is executed by the OS 5 to be described later, can calculate a check progress ratio representing the ratio of checked memory of the whole memory (can obtain information showing the progress status). As a result, every time checking the amount of memory needed to start an application, the OS 5 can start the application. Moreover, the OS 5 can determine whether or not there is a possibility to find memory needed to start the application. Consequently, when determining that the memory needed to start or maintain the application is insufficient (for example, when determining that spare memory is insufficient), the OS 5 can determine a service cannot be continued and notify it to the clusterware.

The range of Memory area of the ACPI information 32 may be set for each memory module, or may be set in any address range.

Further, as tools for assisting startup and stoppage of the OS 5, the server device 1 has a boot loader 41, a kernel image writer 42 (a kernel image writing part), and a kernel image loader 43.

The boot loader 41 (an OS execution unit) is used by the FW 3 to assist startup of the OS 5. In general, startup of an operating system includes a complicated process and the process varies with the kind of the OS. Therefore, as a mechanism to hide the details thereof and simplify an operation by the FW 3, the boot loader 41 is used. Meanwhile, in a case where the FW 3 closely cooperates with the OS 5 and is able to directly start the OS 5, the boot loader 41 may be omitted.

The kernel image writer 42 and the kernel image loader 43 are used to store and restore an execution image of a kernel which is the core module of the OS 5 into the nonvolatile memory 23. The present invention assumes to end an application and store only an execution image of the kernel for the purpose of reducing the amount of data. Therefore, the kernel image writer 42 stores into the nonvolatile memory 23 a kernel execution image after necessary information is moved to the FW check target memory 21 by memory migration. In a case where the capacity of the nonvolatile memory 23 and an access speed are sufficiently high, the kernel image writer and the kernel image loader may be configured to also store and restore an execution of image of part of an application.

The OS 5 has a function as a general operating system, and also has a function relating to memory and a function relating to startup of an application (AP).

As shown in FIG. 1, the OS 5 has a memory check unit 51, a memory configuration information table 52, a memory configuration information table (for comparison) 53, a memory page management table 54, an AP startup unit 55 (an application startup unit), and an AP startup condition table 56. The OS 5 and the respective units included by the OS 5 in this exemplary embodiment are realized by execution of a program stored in a storage device (not illustrated) of the server device 1 by an arithmetic device (not illustrated).

The memory check unit 51 (a memory check thread function) refers to the memory page management table 54 and executes a check on the FW check target memory 22 from the OS 5. Then, the memory check unit 51 writes the result of the check into the memory page management table 54. A plurality of memory check units 51 can operate in parallel depending on the number of processor cores included by the server device 1.

The memory configuration information table 52 is for storing and using information retrieved by the kernel from the ACPI information 32. The memory configuration information table (for comparison) 53 is used for, when the ACPI information 32 is loaded again at the time of second startup or more for recovering the execution image of the kernel from the nonvolatile memory 23, checking whether or not the configuration has changed from a previous one.

The memory page management table 54 (including check progress status information) expresses a physical memory as a memory page, which is a management unit in the kernel, and holds the information. The memory page management table 54 manages, in addition to conventional information showing the status of a memory page, the presence or absence of a memory check, the result thereof and information showing whether or not a corresponding memory area can be used as a memory allocation target, for each memory page.

The memory page management table 54 is generated by the OS 5 on the basis of information such as the address and size of a physical memory retrieved from the ACPI information 32. Moreover, of the memory page management table 54 to be described later, an item Check Status Attribute showing a memory check result and an item State showing whether or not it is possible to assign in response to a memory request are managed by the OS 5 (for example, the memory check unit 51).

FIG. 3 shows an example of information included by the memory page management table 54. Referring to FIG. 3, the memory page management table 54 includes Memory area, NUMA Node, State, and Check Status Attribute. For example, the first row of FIG. 3 shows that Memory area "0x00000000-0x0000ffff," NUMA node "node 0," State "valid," and Check Status Attribute "FW checked (normal)" are associated. In other words, the first row of FIG. 3 shows that Memory area "0x00000000-0x0000ffff" belongs to the node 0, the memory area has been checked by the FW 3 and a fault has not been detected (normal). Moreover, it shows the state of the address range is valid.

Check Status Attribute of the memory page management table 5 indicates, for example, any of the following attributes: FW checked (normal), FW checked (fault), OS checked (normal), OS checked (fault), OS checking, and unchecked. Moreover, the item Status represents whether or not it is possible to assign in response to a memory request, and indicates any of the following two states: "valid" representing a state that assignment is possible, and "invalid" representing a state that assignment is impossible. State is valid in a case where Check Status Attribute is either FW checked (normal) or OS checked (normal), and State is invalid in a case where Check Status Attribute is any of FW checked (fault), OS checked (fault), OS checking and unchecked.

In FIG. 3, Memory area is written in the form of a memory range for ease of explanation. However, it is desirable actually to manage Memory area for each memory page on the memory page management table 54. This is because the result of a memory check is reflected on the memory page management table 54 every time the check is complete, and the minimum unit for managing State (valid/invalid) representing whether it is usable or not in the OS 5 is a memory page.

The AP startup unit 55 starts an application in accordance with a memory amount representing the amount of a memory area checked by the memory check unit 51. For example, the AP startup unit 55 refers to the memory page management table 54 and the AP startup condition table 56 and, in a case where a memory amount checked by the memory check unit 51 exceeds a memory amount needed to start an application, starts the application. Moreover, the AP startup unit 55 refers to the AP startup condition table 56, and starts an application in accordance with the order of startup shown by the AP startup condition table 56. Thus, the AP startup unit 55 refers to the memory page management table 54 and the AP startup condition table 56, and starts an application satisfying a condition in order.

The AP startup condition table 56 (condition information) has information such as the order of startup of an application, dependency, and a memory amount needed to start the application. In other words, the AP startup condition table 56 shows conditions necessary for startup for each application.

FIG. 4 shows an example of information included by the AP startup condition table 56. Referring to FIG. 4, the AP startup condition table 56 includes Startup Order, Application, NUMA Node, Required Memory Amount, and Dependency. For example, the first row of FIG. 4 shows that an application with Startup Order "1" is "network service," NUMA Node is not designated, Required Memory Amount is 30 MB, and it has no dependency.

FIG. 4 does not show a case where the AP startup condition table 56 manages programs one by one, but shows a case of managing programs by a unit of a service for each group of functions. This is because an applications usually realizes one function by cooperation of a plurality of programs. Meanwhile, the unit managed by the AP startup condition table 56 may be changed as needed.

Further, for example, as shown on the third and fourth rows of FIG. 4, the AP startup condition table 56 manages Memory Amount for each NUMA Node. This is because it is effective in a system of NUMA architecture to set a limitation so as to execute an application only in combination of specific processor and memory at a close distance for the purpose of making resource use in the whole system efficient. This is also because depending on the progress of a memory check, a trouble may occur in startup or operation of an application unless a usable memory satisfies a requirement on all the NUMA nodes. Thus, to grasp what amount of memory is used by each NUMA node, the AP startup condition table 56 includes information representing a required memory size for each NUMA node.

Further, the AP startup condition table 56 includes information showing dependency. This is because there is case where an application has dependency. For example, in order to start a service of Web server, a network function needs to be usable. In such a case, it is possible to refer to the AP startup condition table 56 and thereby wait before starting the Web service until startup of the network service is complete.

Further, the lowest row of FIG. 4 includes an item "Spare Memory." The AP startup condition table 56 has the item "Spare Memory" for the purpose of determining whether cluster failover should be caused in a case where memory such as cache and buffer need to start an application and provide a stable operation service is insufficient. In general, business load usually varies and the load often rises in a specific time period. Therefore, in order to cope with such rise of the load, memory is implemented in the server device 1 by estimating the maximum amount of load. However, there is a case where, when memory decreases due to a fault, sufficient spare memory is not secured in spite of success in startup. Because it is possible to determine in such a case that a business service cannot be continued, it is possible to notify to the clusterware. In other words, the OS 5 can refer to the memory page management table 54 and the AP startup condition table 56 and, in a case where it is determined that spare memory is insufficient, instruct another server device (information processing device) to take over execution of the application. As information for that, FIG. 4 uses an idea of spare memory as one of the startup conditions.

An example of the configuration of the server device 1 has been described above. Next, with reference to FIGS. 5 and 6, a difference between a case of starting the kernel after completion of memory check and the server device 1 of the present invention will be briefly described. In FIGS. 5 and 6, it is assumed that 2 to 3 TB of memory is implemented, and it is anticipated that it takes 20 minutes to execute memory check. For ease of explanation, it takes 3 minutes equally to execute other processes.

FIG. 5 briefly shows operation until a business service is started after startup of the hardware. Referring to FIG. 5, in the case of starting the kernel after completion of memory check, it is impossible to start the kernel until memory check (POST) by the firmware is complete after the server device is powered on. Therefore, after check on all the memory areas implemented is complete, startup of the kernel and startup of an application are executed sequentially. Therefore, a time needed before a business service is started is the total of times relating to the respective processes. For example, it takes 29 minutes before the business service is started after the server device is powered on.

On the other hand, in the server device 1 of this exemplary embodiment, the POST processing unit 31 of the FW 3 inspects only the FW check target memory 31. After memory check (POST) by the POST processing unit 31, kernel startup is executed by using the FW check target memory 21 checked by the FW 3. Therefore, a time to start kernel startup is shortened. In kernel startup, memory check (OS) by the memory check unit 51 of the OS 5 is started in parallel with the initiation process by the OS 5. The kernel can recognize and initialize implemented processor cores and start memory check (OS) at any timing after the initialization progresses up to a state where parallel processing can be executed. Because the kernel initializes various components of the hardware and it takes time, initialization thereof and memory check (OS) run in parallel. The OS 5 properly distributes load and continues the initialization and the memory check while managing the load status of each processor core. Application startup is executed by the AP startup unit 55 by comparing the progress of memory check (OS) with the AP startup condition table 56. According to FIG. 5, it is apparent that a time to start a business service is earlier in the server device 1 than in the case of starting the kernel after completion of memory check, because the server device 1 does not wait until completion of check on all the memory ranges.

FIG. 6 briefly shows a situation that, as a result of execution of memory check, a business service cannot be started and cluster failover is caused. Referring to FIG. 6, in the case of starting the kernel after completing memory check, the following processes are forced to wait, as in FIG. 5, until the server device is powered on and thereafter check of all the memory areas is complete in memory check (POST). A recent server device has a plurality of memory controllers and widely uses a system that each of the memory controllers controls a plurality of memory modules. Therefore, when the memory controller breaks down, or when a connection path between the memory controller and the memory modules cause trouble, there is a case where the memory modules simultaneously fail and the memory decreases. Starting an application under such a condition results in memory shortage. Consequently, a fault in startup of the application or a delay in operation is detected by the clusterware and, with the detection, cluster failover is executed. Accordingly, it is apparent that in the case of starting the kernel after completing memory check, it takes long time before detecting that a business service cannot be started and notifying it to the clusterware.

On the other hand, as in FIG. 5, the server device 1 needs a shorter time before memory check (OS) starts. In a case where the memory check (OS) indicates that a fault in memory is detected and the memory cannot be used, it is possible to compare the amount of unchecked memory with the AP startup condition table 56 and thereby detect, before an application is actually started, that none of the business services can run. In general, an extra memory is implemented in a server device executing business processing, in case of sudden rise of the load. Registration of such an extra memory to be allocated in the AP startup condition table 56 makes it possible to detect that only a memory amount becomes available that may succeed in start of business but may cause trouble in later operation. According to FIG. 6, it can be found that notification to the clusterware is executed at earlier timing than in the conventional method.

Next, with reference to FIGS. 7 to 11, an example of the operation of the server device 1 will be described. First, with reference to FIG. 7, an example of the operation of the server device 1 until startup is complete after the server device is powered on at the time of first startup.

Referring to FIG. 7, when the server device 1 is powered on, the POST processing unit 31 executes a POST process to check for the FW check target memory 21 (step S101). Moreover, in the case of detecting a memory fault, accompanied by change in size of the FW check target memory 21, the POST processing unit 31 disables the part, additionally executes memory check as necessary, and reflects the result on the ACPI information 32.

Next, the boot loader 41 loads the kernel of the OS 5 onto the FW check target memory 21 and sets the instruction counter of the processor to a kernel program starting position, thereby transferring the process to the kernel (step S102). Meanwhile, if a fault has been detected by the POST processing unit 31, the abovementioned process is executed avoiding the disabled part of the memory.

Subsequently, the kernel executes a startup process by using only the range of the FW check target memory 21 (step S103). In general, at the earliest stage of kernel startup, the kernel usually uses only an address in a lower and limited range. However, in the case of an OS of a type which does not satisfy such a generality, it is possible to notify a usable memory range as a parameter from the boot loader 41. Moreover, in an initialization process, the kernel retrieves the ACPI information 32 to obtain the characteristics of each component (type of CPU (Central Processing Unit), memory size, NUMA architecture information, and the like). Then, the kernel stores the obtained information into the memory configuration information table 52 (step S104), and also reflects the information on the memory page management table 54 (step S105). In a case where the FW check nontarget memory 22 is considerably large compared with the FW check target memory 21, the memory page management table 54 is also huge and may not be held in the FW check target memory 21. In such a case, it is possible to cope with it by keeping the table small in size immediately after startup and expanding it in size when available memory increases.

When finishing obtaining the ACPI information 32 from the firmware, the kernel enables a CPU which is on the server device 1 and is other than the CPU used for startup, and starts operation as an asymmetric multi-CPU system of NUMA architecture. In other words, the kernel executes a NUMA initialization code (step S106). After that, the kernel can execute parallel processing on any processor core.

In consideration of the NUMA architecture, the kernel executes the memory check unit 51 on the CPU close to the memory (step S107). The memory check units 51 share the memory ranges and check the FW check nontarget memory 22 in parallel, and the kernel proceeds with initialization of a device or the like other than the memory. When an application gets ready to start, the kernel starts the AP startup unit 55 (step S108). The AP startup unit 55 waits memory check to progress while referring to the AP startup condition table 56 and, when the condition is satisfied, starts the application (or service). The AP startup unit 55 continues this until startup is complete.

The memory check unit 55 operates on each processor core. The unit of memory to be checked and the share and parallelism for each memory check thread may be freely changed depending on the configurations of OS and hardware.

An example of the operation of the server device 1 until startup is complete after the server device is powered on at the time of first startup has been described above. Next, with reference to FIG. 8, an example of the flow of the memory check process, which is a process at step S107 of FIG. 7, will be described.

Referring to FIG. 8, the memory check unit 51 refers to the memory page management table 54 to determine whether or not there is a memory range with Check Status Attribute "unchecked" (step S201). In a case where there is no memory range with Check Status Attribute "unchecked" (step S201, No), the memory check unit 51 ends the process. On the other hand, in a case where there is a memory range with Check Status Attribute "unchecked" (step S201, Yes), the memory check unit 51 changes Check Status Attribute of the target memory range of the memory page management table 54 to "OS checking" (step S202) and thereafter executes memory check (step S203). By thus changing Check Status Attribute to "OS checking" it is possible to share the status of the memory check within the whole server device 1.

The memory check unit 51 of the OS 5 performs writing into the FW check nontarget memory 22 and thereafter reads out data, and checks whether or not the data having been read out is inconsistent (step S204). Moreover, the memory check unit 51 checks whether or not an error is detected on the HW 2 as a result of writing into the FW check nontarget memory 22 and MCE (Machine Check Exception) occurs (step S205). The memory check unit 51 executes memory check in the abovementioned manner, for example.

In a case where written data and retrieved data are inconsistent (step S204, Yes), or in a case where MCE occurs (step S205, Yes), the memory check unit 51 determines that the target memory range is faulty. Then, the memory check unit 51 updates Check Status Attribute in the memory page management table 54 to "OS checked (fault)" (step S206). On the other hand, in a case where the data having been read out is not inconsistent (step S204, No) and MCE does not occur (step S205, No), the memory check unit 51 validates the memory area which is the target of check (step S207). Herein, validating refers to registering checked memory as available memory to the memory management system in the kernel, and makes it a target to be allocated in response to a memory request. Moreover, with respect to the validated memory area, the memory check unit 51 updates the memory page management table 54 so that Check Status Attribute is "OS checked (normal)" and State is "valid" (step S208). After that, the memory check unit 51 refers to the memory page management table 54 again to determine whether or not there is a memory range with Check Status Attribute "unchecked" (step S201).

An example of the flow of the memory check process, which is the process at step S107 of FIG. 7, has been described above. Meanwhile, a method for memory check by the memory check unit 51 is not limited to the case described above. The memory check unit 51 can employ various methods proper to the architecture of the HW 2 and execute memory check. Moreover, for example, in addition to the process described above, the server device may be configured to have a unit for the AP startup unit 55 to be able to refer to an available memory amount. Moreover, the server device may be configured to perform notification to the AP startup unit 55 at any time when validation of the memory is complete, and accelerate startup of an application. Next, with reference to FIG. 9, an example of the flow of the AP startup process, which is the process at step S108 of FIG. 7, will be described.

Referring to FIG. 9, the AP startup unit 55 refers to the AP startup condition table 56 and reads out information such as Memory Amount needed to start an application and Dependency (step S301).

Subsequently, the AP startup unit 55 checks whether an application to be started satisfies a startup condition other than Memory Amount, for example, whether an application on which the application to be started has dependency (an application required to be started first) has already been started (step S302). In a case where the application to be started does not satisfy a startup condition other than Memory Amount (step S302, No), the AP startup unit 55 does not start the application and selects another application. On the other hand, in a case where the application to be started satisfies a startup condition other than Memory Amount (step S302, Yes), the AP startup unit 55 refers to the memory page management table 54 and calculates the amount of available memory for each node (step S303). Then, the AP startup unit 55 refers to the memory page management table 54 to determine whether the memory request is satisfied or not (step S304).

In a case where the amount of available memory is not more than the amount of memory required by the application (step S304, No), the AP startup unit 55 waits until the amount of available memory exceeds the amount of memory required by the application. On the other hand, in a case where the amount of available memory is more than the amount of memory required by the application (step S304, Yes), the AP startup unit 55 starts the application (step S305). After that, the AP startup unit 55 refers to the memory page management table 54 and determines from the amount of remaining memory whether or not all the applications can be started (step S306). In the case of detecting shortage of memory (step S306, No), the AP startup unit 55 notifies to the clusterware. On the other hand, in the case of not detecting shortage of memory (step S306, Yes), the AP startup unit 55 refers to the AP startup condition table 56 and checks whether or not all the applications are started (step S307). In a case where all the applications are started (step S307, Yes), the AP startup unit 55 ends the process. On the other hand, in a case where an application to be started is still present (step S307, No), the AP startup unit 55 returns to step S301 to execute new application startup.

An example of the flow of the AP startup process, which is the process at step S108 of FIG. 7, has been described above. Next, with reference to FIG. 10, an example of the flow of a process to stop the server device 1 will be described. This process is executed on the assumption that in order to increase the speed of next startup, a kernel execution image is stored into and restored from the nonvolatile memory 23 over stoppage of power supply. Such storage and restoration is a general existing technique called hibernation, but the system of the present invention has a characteristic in decreasing a kernel execution image so that it is held in the FW check target memory 21.

Referring to FIG. 10, a process to stop the server device 1 is started by the user's push-down of the shutdown button or instruction to shut down by submitting command. When the process to stop the server device 1 is started, the OS 5 ends an application, and frees memory used by the application (step S401).

Subsequently, the OS 5 frees memory which does not directly relate to the application (step S402). This process includes unloading a kernel module unnecessary for hibernation, freeing a shared memory, writing a dirty buffer to a disk, freeing cache, and the like.

Next, in order to store a kernel execution image into the nonvolatile memory 23, cleanup of memory in use is carried out. An object of this process is to return to a state immediately after kernel initialization before a used memory range is expanded, so that a kernel execution image is held in the FW check target memory 21. Therefore, memory placed in the FW check nontarget memory 22 while operating is freed or moved.

For example, in a case where, because the whole memory amount is large, the memory page management table 54 is expanded on the way and the memory page management table 54 is also stored in the FW check nontarget memory 22, the expanded area is freed so as to be held in the FW check target memory 21. Moreover, as another example, a memory pool is one of the cleanup targets. If the OS 5 runs for a long time, the memory is fragmented and the memory used by the kernel also spreads in the whole memory area. In order to speedily respond to a memory allocation request, the kernel has a function to, regarding frequently used management information such as process information, network packet and directory path information, previously pool memory corresponding to the size thereof and, when it decreases by a given amount, allocate new memory and fill it to the pool. Therefore, when filling memory to the pool, memory may also be allocated from the FW check nontarget memory 22, depending on the free memory status of the system. As a result of repeating fill and reduction of the pool in accordance with change of the load condition of the system, even if the memory is freed at step S401 and step S402, such memory which "is not used but is pooled by the kernel" may also remain in the FW check nontarget memory 22. Then, in order to use the FW check target memory 21 and efficiently store a kernel execution image, such memory is moved to the memory range of the FW check target memory 21. Such memory movement is an existing technique called memory migration. Thus, necessary memory of the FW check nontarget memory 22 is moved to the FW check target memory 21 (step S403).

As described above, through steps S401 to S403, the whole FW check nontarget memory 22 is brought to an unused state and is removed from the target of new memory allocation by the kernel. Then, regarding the memory range corresponding to the FW management nontarget memory 22 on the memory page management table 54, State is changed to "invalid" and Check Status Attribute is changed to "unchecked" (step S403). By thus updating the memory page management table 54, it is possible at the time of next startup to, when retrieving a kernel execution image from the nonvolatile memory 23, use the memory page management table 54 again and execute memory check.

Next, the OS 5 copies the memory configuration information table 52 to the memory configuration information table (for comparison) 53 (step S405). This is for checking change of the configuration during stoppage of power supply.

After that, the kernel executes the sleep process (step S406) and, after each function of the kernel stops, transfers the process to the kernel image writer. In the hibernation process, generally, the whole OS 5 stores its image onto disk while operating. However, in the above operation example, all the applications are stopped, the kernel function is reduced to the minimum state, and the kernel enters the sleep state. This is for allowing execution of the kernel image storage/restoration process with a limited memory amount of the FW check target memory 21, and also reducing the amount of data read and written form and into the nonvolatile memory 23. Moreover, the kernel executes the sleep process because when the kernel stores its image in the operating status, the image after restoration also becomes unstable.

Upon taking over the process from the kernel, the kernel image writer 42 stores an execution image of the kernel into the nonvolatile memory 23 (step S407). A memory area into which the kernel image writer 42 stores may be the whole range of the FW check target memory 21, or may be only a necessary page. In the case of storing only a necessary page, such an implementation example is considered that the kernel image writer 42 analyzes the address space of the kernel and stores only a page in use from the memory management information. In consideration of a time to transfer the amount of memory to store and a time required to analyze, any method can be used. After storing the execution image of the kernel is complete, the server device 1 is powered off (step S408). A shutdown process is completed by such a process, for example.

An example of the flow of the process to stop the server device 1 has been described above. Next, with reference to FIG. 11, an example of the flow of a process to start for a second time or more will be described.

Referring to FIG. 11, after the server device is powered on, the POST processing unit 31 executes memory check on the FW check target memory 21 (step S501). This step is the same as in the initial startup shown in FIG. 7. However, it is different if a fault is detected in the FW check target memory 21. Although a faulty memory may be disabled at the time of initial startup, a faulty memory cannot be disabled simply in the second startup or more.

Subsequently, the FW 3 checks whether or not a kernel execution image having been swapped out is present in the nonvolatile memory 23 (step S502). As a method for checking, it is possible to use any method such as a writing information showing presence or absence of a kernel execution image into any area of the nonvolatile memory 23, or storing it into the FW 3 itself. Moreover, the FW 3 checks whether or not the FW check target memory is not faulty and is the same as in the last startup (step S503). Meanwhile, an additional step, for example, adding an electronic signature to a kernel execution image and checking whether it has not been falsified while the server device is stopped, may be executed at the timing of step S502 or step S503.

In a case where an execution image stored on the nonvolatile memory 23 is not present (step S502, No), or in a case where the FW check target memory 21 has been changed (step S503, No), the startup process thereafter is executed in the same manner as described with FIG. 7. On the other hand, in a case where a kernel execution image is present on the nonvolatile memory 23 (step S502, Yes) and the FW check target memory 21 has no problem (step S503, Yes), the FW 3 starts the kernel image loader 43.

The kernel image loader 43 reads out the stored kernel execution image from the nonvolatile memory 23 and restores it on the FW check target memory 21 (step S504). Subsequently, the kernel image loader 43 calls a kernel resume function and transfers the process to the kernel (step S505). Such a resume process is included in the existing hibernation technique.

Next, the kernel reads out the ACPI information 32 and stores into the memory configuration information table 52 (step S506). Then, the kernel compares the memory configuration information table 52 with the memory configuration information table (for comparison) 53 stored in the process shown in FIG. 10 (stored before hibernation) (step S507).

In a case where there is a difference in configuration as a result of the comparison (step S508, Yes), the kernel updates the management information of the kernel to reflect the difference. Moreover, in a case where the memory configuration is different, the kernel also reflects the difference on the memory page management table 54 (step S509). In a case where a memory module has been added and the size of the memory page management table 54 is not enough, the kernel recreates the table. Thus, in a case where the configuration of the FW check nontarget memory 22 or of an I/O device or the like connected to the system has been changed while the server device is powered off, the kernel detects the change.

On the other hand, in a case where there is no difference in configuration (step S508, No), or after the kernel reflects the difference at step S509, the kernel executes the memory check units 51 in parallel on the respective processor cores (step S510). Step S510 is the same as step S107 of FIG. 7 (the process shown in FIG. 8). Moreover, the kernel continues initialization of the device or the like other than the memory in parallel and, when an application gets ready to start, starts the AP startup unit 55 (step S511). Step S511 is the same as step S108 of FIG. 7 (the process shown in FIG. 9).

An example of the flow of the process to start for a second time or more has been described.

Thus, the server device 1 in this exemplary embodiment has the POST processing unit 31, the memory check unit 51, and the AP startup unit 55. Such a configuration makes it possible to start the OS 5 at the timing of completion of check on the FW check target memory 21 by the POST processing unit 31. Moreover, such a configuration can cause the memory check unit 51 of the OS 5 to execute check on the FW check nontarget memory 22 and, in accordance with the process of the check on the FW check nontarget memory 22, cause the AP startup unit 55 to start an application. In other words, for example, every time the amount of memory checked by the memory check unit 51 exceeds the amount of memory required to start an application, the AP startup unit 55 can start the application. As a result, the timing of start of application startup can be set ahead before completion of check on the whole memory, and it becomes possible to speedily execute applications.

Further, the server device 1 in this exemplary embodiment can set the timing of determination whether the whole business application can be executed earlier before completion of check of the whole memory.

Further, the kernel image writer 42 in this exemplary embodiment is configured to store a kernel execution image after necessary information is transferred to the FW check target memory 21 into the nonvolatile memory 23. Such a configuration can reduce the amount of data and time required for save and restoration at the time of hibernation.

Second Exemplary Embodiment

Next, with reference to FIGS. 12 to 15, a second exemplary embodiment will be described. The first exemplary embodiment describes a case of applying the present invention to the server device 1 having a characteristic that the content of memory is cleared when the device is stopped or restarted. It is general behavior that the content of memory is cleared when the device is powered off or restarted, but a server device 6 has a characteristic that the content of memory is held through shutdown or restart of the device, depending on the usage. In the second exemplary embodiment, the server 6 having such a characteristic will be described. A description of what overlaps the content described in the first exemplary embodiment will be omitted below.

The characteristic of still holding the content of memory through stoppage or restart of the device is realized by:
(1) using a nonvolatile memory, which keeps a value without power supply as a hardware characteristic; and
(2) applying electric current without resetting data even when the device is stopped or restarted, and holding the content of memory. The characteristic that data is not cleared in restart is very useful in that a time required to restart a business service after restart can be shortened, in a case where data used by an application is very large and it takes time to load from a disk device to memory.

Figure 12:
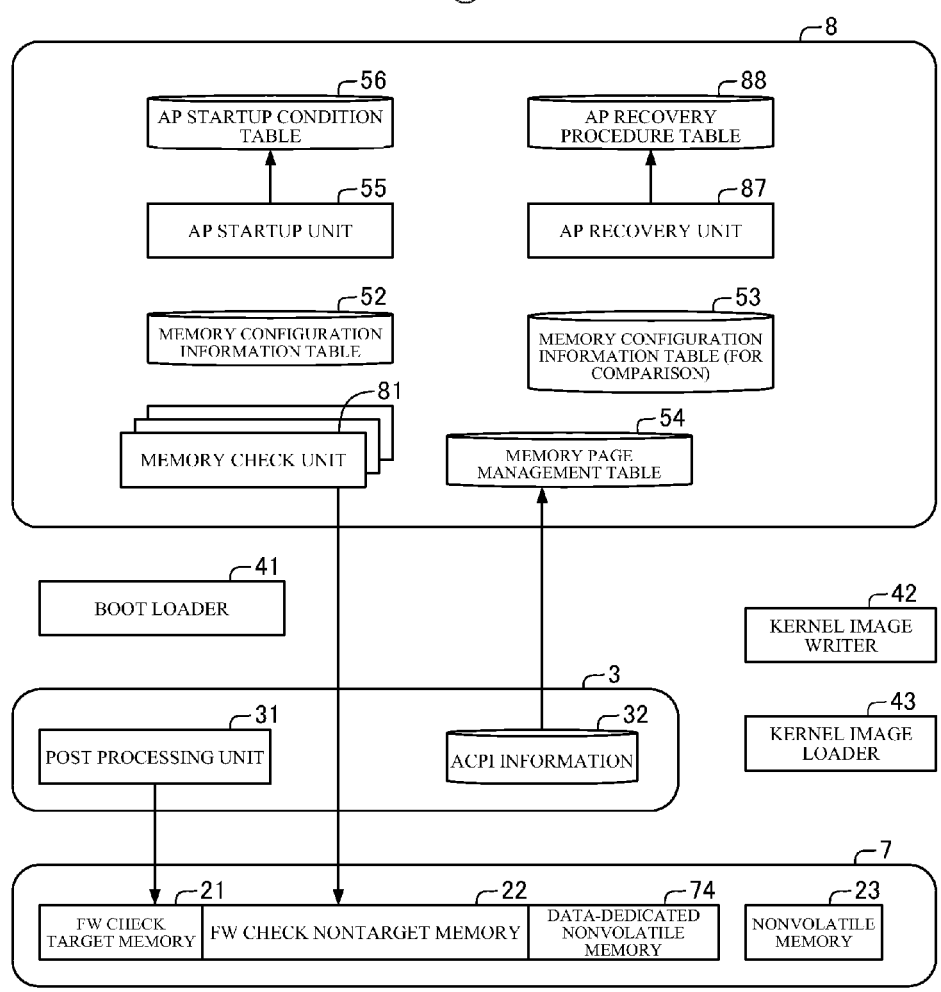
FIG. 12 is a block diagram showing an example of the configuration of a server device according to a second exemplary embodiment of the present invention.

On the other hand, data used during operation by the kernel or the application is fluctuating, so that an advantage to hold it through stoppage or restart of the server device is little. In particular, a nonvolatile memory used in the realization method (1) usually has a characteristic that a bit unit price is higher or access performance is lower as compared with a DRAM (Dynamic Random Access Memory) used as a general server device memory. Therefore, a compromise plan is, as shown in FIG. 12, a device having a configuration including both a volatile memory area which is general purpose, high-speed and inexpensive, such as the FW check target memory 21 and the FW check nontarget memory 22, and a nonvolatile memory area which is dedicated for data, low-speed and expensive such as a data-dedicated nonvolatile memory 74. This exemplary embodiment will describe an example of applying the present invention to the server device 6 in which memory is not cleared when the device is powered off or restarted.

Referring to FIG. 12, the server 6 in this exemplar embodiment includes a HW 7, the FW 3, the boot loader 41, the kernel image writer 42, the kernel image loader 43, and an OS 8.

When compared with the configuration of the server device 1 described in the first exemplary embodiment, the HW 7 further includes the data-dedicated nonvolatile memory 74. A memory area used for data has a different characteristic from the FW check target memory 21 and the FW check nontarget memory 22 used by the OS 8 or the like, and requires definite distinction to be used. In this exemplary embodiment, information of the characteristic and size of each memory area is provided by the ACPI information 32. In a case where the data-dedicated nonvolatile memory 74 is connected not as a usual memory area but is connected as an I/O device to the system via a different interface, the information may be provided by a method other than the ACPI information 32.

Further, the operation of a memory check unit 81 of the OS 8 is different from the operation of the memory check unit 51 described in the first exemplary embodiment.

The abovementioned difference comes from that the memory check unit 81 needs to execute check on the data-dedicated nonvolatile memory 74 by a method which does not destroy the content of data. The memory check unit 81 executes check by a method such as detect an unused area and carry out a writing test or, instead of writing any data, read out already written data and write it back.

Meanwhile, it can also be expected to, at the time of restart, cause an AP recovery unit 87 to execute a consistency check from the upper layer and thereby omit check on the data-dedicated nonvolatile memory 74 by the memory check unit 81. Although strictness and completeness slightly decrease, reliability can be maintained by making up for the decrease with a regular memory scrubbing function by the FW 3, or the like.

Further, the OS 8 includes, in addition to the AP startup unit 55 and the AP startup condition table 56, an AP recovery unit 87 and an AP recovery procedure table 88. Even if memory is held through restart, in a case where the server device is restarted without execution of a normal end process due to cluster failover or unexpected reset, data writing on memory is not complete and it becomes inconsistent. A procedure for recovering from such a situation is registered in the AP recovery procedure table 88, and is executed by the AP recovery unit 87.

FIG. 13 shows an example of information included by the AP recovery procedure table 88. Referring to FIG. 13, the AP recovery procedure table 88 includes Application, Recovery Procedure, Dependency, and Used Memory Range. For example, on the first row of FIG. 13, Application "network service," Recovery Procedure "none," Dependency "none" and Used Memory Range "none" are associated.

Referring to the AP recovery procedure table 88 shown in FIG. 18, Application "network service" and Application "clusterware service" run without using the data-dedicated nonvolatile memory 74. Therefore, they do not need recovery procedures. The other applications and services delete temporary data and unnecessary cache or secure consistency of data in progress in accordance with the respective characteristics. Then, the AP recovery procedure table 88 defines the procedures of these processes. For example, regarding Shared Memory shown in FIG. 13, it is determined to execute the following steps:
(1) in order to respond to an attach request by the application, registering an area where data is stored as shared memory to the kernel without clearing the data;
(2) in a case where fixed data is corrupted, reloading original data; and
(3) in a case where a series of data requiring atomic update is in the half-updated state, discarding the data in progress and recovering.

Herein, in order to execute the step (3), the application needs to include update history (journal) of data and have a transaction rollback function. This is an existing technique implemented in a database application and a file system. In a case where it is impossible to recover even after executing the above, it is notified to the clusterware and failover is executed.

Subsequently, with reference to FIG. 14, an example of the operation of the server device 6 in this exemplary embodiment will be described.

Referring to FIG. 14, steps S601 to S606 at the time of startup are almost the same as the operation of the server device 1 described in the first exemplary embodiment.

After step S606, the memory check unit 81 is executed (step S607). At step S607, the memory check unit 81 executes check by, for example, detecting an unused area and carrying out a writing test or, instead of writing any data, reading out already written data and swapping in. Moreover, in a case where a given condition is satisfied, the memory check unit 81 can omit check on the data-dedicated nonvolatile memory 74.

After executing check on the data-dedicated nonvolatile memory 74 in a case where the memory check unit 51 executes the check, or after the kernel recognizes in a case where the memory check unit 51 does not execute the check, the memory page management table 54 is updated so that State of an available memory page and Check Status Attribute become "valid" and "OS checked (normal)," respectively. The rest of the operation is the same as in the first exemplary embodiment.

In parallel with memory check by the memory check unit 81, the AP recovery unit 87 executes the AP recovery process (step S608). Then, after the AP recovery process by the AP recovery unit 87, the AP startup unit 55 executes the AP startup process (step S608). The AP startup process at step S608 is the same as the operation of the server device 1 described in the first exemplary embodiment.

Figure 15:
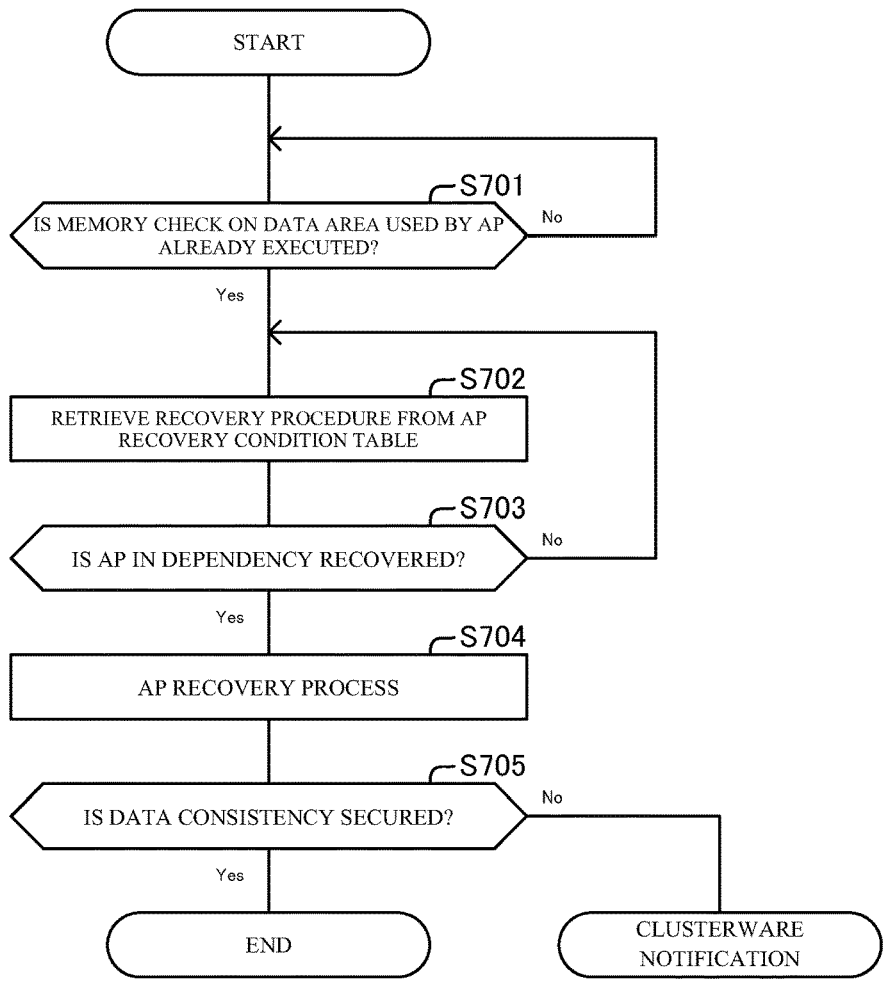
FIG. 15 is a flowchart showing an example of an AP recovery process shown in FIG. 14.

Next, with reference to FIG. 15, an example of the flow of the AP recovery process will be described. Referring to FIG. 15, the AP recover unit 87 refers to the memory page management table 54 to confirm whether or not check on a memory area to be used by an application has ended (step S701).

In a case where check on a memory area to be used by an application has not ended (step S701, No), the AP recovery unit 87 waits until check on a required memory area ends. On the other hand, in a case where check on a memory area to be used by an application has ended (step S701, Yes), the AP recovery unit 87 refers to the AP recovery procedure table 88 and retrieves a recovery procedure (step S702). Moreover, the AP recovery unit 87 refers to the AP recovery procedure table 88 to see whether or not an application having dependency with the abovementioned application has already recovered (step S703). In a case where an application having dependency has not recovered (step S703, No), the AP recovery unit 87 returns to step S702 to retrieve a recovery procedure of the other application. Thus, the AP recovery unit 87 confirms dependency on the AP recovery procedure table 88 and retrieves a recovery procedure for an application satisfying a condition.

In a case where an application having dependency has already recovered (step S703), the AP recovery unit 87 executes the recovery process in accordance with the procedure registered on the AP recovery procedure table 88 (step S704). Then, in a case where the recovery process succeeds (step S705, Yes), that is, in a case where consistency of data through recovery of the application is secured, the AP recovery unit 87 ends the AP recovery process. On the other hand, in a case where the recovery process does not succeed (step S705, No), the AP recovery unit 87 notifies it to the clusterware.

Thus, the server device 6 proceeds with recovery of application data and startup of an application with reference to the AP recovery procedure table 88, the AP startup condition table 56, and the amount of checked memory in the memory page management table 54.

Accordingly, the present invention can also be applied to the server device 6 having a characteristic of holding the content of memory.

Third Exemplary Embodiment

Next, with reference to FIG. 16, a third exemplary embodiment will be described. In the third exemplary embodiment, the configuration of an information processing device 9 will be briefly described.

Figure 16:
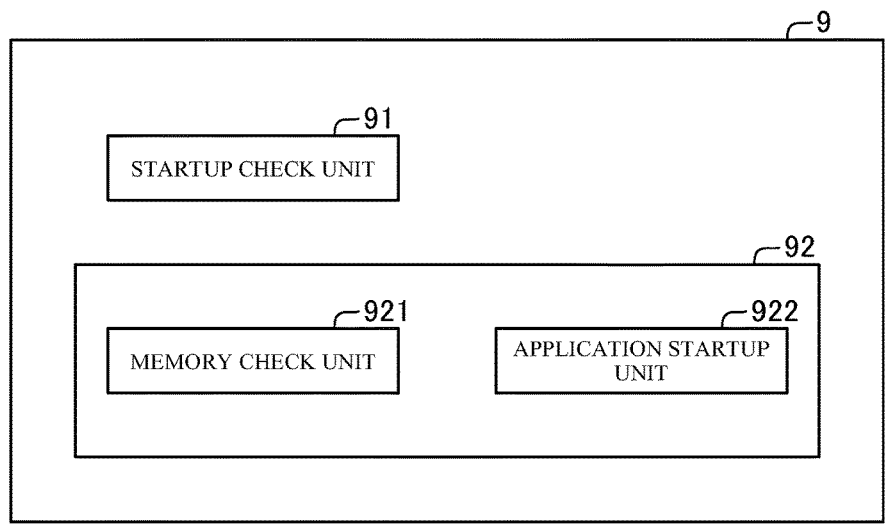
FIG. 16 is a schematic block diagram showing an example of the configuration of a server device according to a third exemplary embodiment of the present invention.

Referring to FIG. 16, the information processing device 9 in this exemplary embodiment includes a startup check unit 91 and an operating system 92. Moreover, the operating system 92 has a memory check unit 921 and an application startup unit 922.

The startup check unit 91 checks a predetermined range of memory area. Moreover, the startup check unit 91 starts the operating system 92 by using the checked memory area.

As described above, the operating system 92 has the memory check unit 921 and the application startup unit 922. The memory check unit 921 checks a memory area other than a memory area having been checked by the startup check unit 91. The application startup unit 922 starts an application depending on a memory amount representing the amount of a memory area having been checked by the memory check unit 921.

Thus, the information processing system 9 in this exemplary embodiment has the startup check unit 91. The operating system 92 of the information processing device 9 has the memory check unit 921 and the application startup unit 922. Such a configuration allows the startup check unit 91 to check for a predetermined range of memory area, and allows the operating system 92 to start by using the checked memory area. Moreover, such a configuration allows the memory check unit 921 of the operating system 92 to check the remaining memory area, and also allows the application startup unit 922 to start an application depending on the amount of the checked memory. As a result, it becomes possible to set the timing of start of application startup ahead before completion of check on the whole memory, and it becomes possible to speedily execute an application.

The information processing device 9 can be realized by installation of a given program into the information processing device 9. To be specific, a program as another aspect of the present invention is a program including instructions for causing an information processing device to realize a startup check unit configured to check a memory area of a predetermined memory, causing an operating system to start by using the memory area checked by the startup check unit, and causing the operating system to realize: a memory check unit configured to check a memory area other than the memory area checked by the startup check unit of the memory area; and an application startup unit configured to start an application depending on a memory amount representing the amount of the memory area checked by the memory check unit.

Further, an information processing method executed by operation of the information processing device 9 is a method including checking for a memory area of a predetermined memory, and starting an operating system by using the checked memory area, wherein the operating system checks a memory area other than the checked memory area of the memory area, and starts an application depending on a memory amount representing the amount of the checked memory area.

The program and the information processing method having the above configurations also have the same actions as the information processing device 9, and can achieve the object of the present invention mentioned above.

<Supplementary Notes>

The whole or part of the exemplary embodiments disclosed above can be described as the following supplementary notes. The overview of an information processing device and so on according to the present invention will be described below. However, the present invention is not limited to the following configurations.

(Supplementary Note 1)

An information processing device comprising a startup check unit configured to check for a predetermined range of memory area, the information processing device starting an operating system by using the memory area checked by the startup check unit, wherein the operating system has a memory check unit configured to check for a memory area other than the memory area checked by the startup check unit, and an application startup unit configured to start an application depending on a memory amount indicating an amount of the memory area checked by the memory check unit.

(Supplementary Note 2)

The information processing device according to Supplementary Note 1, wherein the application startup unit is configured to start an application when it is determined that a memory amount indicating an amount of a memory area checked by the memory check unit is more than a memory amount needed to start the application.

(Supplementary Note 3)

The information processing device according to Supplementary Note 1 or 2, wherein the application startup unit has condition information showing a condition necessary for startup for each application and is configured to start an application on a basis of the condition information and a memory amount indicating an amount of a memory area checked by the memory check unit.

(Supplementary Note 4)

The information processing device according to Supplementary Note 3, wherein:

the condition information includes information showing a startup order of applications; and the application startup unit is configured to start an application in accordance with the startup order shown by the condition information.

(Supplementary Note 5)

The information processing device according to any of Supplementary Notes 1 to 4, wherein the application startup unit is configured to notify another information processing device that an application cannot be executed when it is determined that a memory area for starting the application is insufficient as a result of check by the memory check unit.

(Supplementary Note 6)

The information processing device according to any of Supplementary Notes 1 to 5, comprising a kernel image writing part configured to store an execution memory image of a kernel into another storage device before power-off, wherein the kernel image writing pat is configured to store therein the execution memory image after movement of the execution memory image to a memory area to be checked by the startup check unit.

(Supplementary Note 7)

The information processing device according to any of Supplementary Notes 1 to 6, comprising a plurality of memory check units, wherein the memory area is checked by the plurality of memory check units in parallel.

(Supplementary Note 8)

An information processing method comprising:

checking for a predetermined range of memory area; and starting an operating system by using the checked memory area, wherein the operating system is configured to check for a memory area other than the checked memory area of a whole memory area, and start an application depending on a memory amount indicating an amount of the checked memory area.

(Supplementary Note 8-1)

The information processing method according to Supplementary Note 8, wherein the operating system is configured to:

check for a memory area other than a checked memory area and also obtain check progress status information showing whether check is already done or not for each predetermined range of the memory area; and starting an application when it is determined that a memory amount indicating an amount of the checked memory area is more than a memory amount needed to start the application on a basis of the check progress status information.

(Supplementary Note 8-2)

The information processing method according to Supplementary Note 8 or 8-1, wherein the operating system has condition information showing a condition necessary for startup for each application and is configured to start an application on a basis of the condition information and a memory amount indicating an amount of a checked memory area.

(Supplementary Note 9)

A program comprising instructions for:

causing an information processing device to realize a startup check unit configured to check for a predetermined range of memory area;

causing the information processing device to start an operating system by using the memory area checked by the startup check unit; and causing the operating system to realize a memory check unit configured to check for a memory area other than the memory area checked by the startup check unit of a whole memory area, and an application startup unit configured to start an application depending on a memory amount indicating an amount of the memory area checked by the memory check unit.

(Supplementary Note 10)

The program according to Supplementary Note 9, wherein:

the memory check unit is configured to check for a memory area other than a memory area checked by the startup check unit of a whole memory area and also obtain check progress status information showing whether check is already done or not for each predetermined range of the memory area; and the application startup unit is configured to start an application when it is determined that a memory amount indicating an amount of the memory area checked by the memory check unit is more than a memory amount needed to start the application on a basis of the check progress status information.

(Supplementary Note 10-1)

The program according to Supplementary Note 9 or 10, wherein the application startup unit has condition information showing a condition necessary for startup for each application and is configured to start an application on a basis of the condition information and a memory amount indicating an amount of a memory area checked by the memory check unit.

(Supplementary Note 11)

A non-transitory computer-readable medium storing a program comprising instructions for:

causing an information processing device to realize a startup check unit configured to check for a predetermined range of memory area;

causing the information processing device to start an operating system by using the memory area checked by the startup check unit; and causing the operating system to realize a memory check unit configured to check for a memory area other than the memory area checked by the startup check unit of a whole memory area, and an application startup unit configured to start an application depending on a memory amount indicating an amount of the memory area checked by the memory check unit.

(Supplementary Note 11-1)

The non-transitory computer-readable medium storing the program according to Supplementary Note 11, wherein:

the memory check unit is configured to check for a memory area other than a memory area checked by the startup check unit of a whole memory area and also obtain check progress status information showing whether check is already done or not for each predetermined range of the memory area; and the application startup unit is configured to start an application when it is determined that a memory amount indicating an amount of the memory area checked by the memory check unit is more than a memory amount needed to start the application on a basis of the check progress status information.

(Supplementary Note 11-2)

The non-transitory computer-readable medium storing the program according to Supplementary Note 11 or 11-1, wherein the application startup unit has condition information showing a condition necessary for startup for each application and is configured to start an application on a basis of the condition information and a memory amount indicating an amount of a memory area checked by the memory check unit.

The program disclosed in the exemplary embodiments and supplementary notes is stored in a storage device or recorded on a computer-readable recording medium. For example, the recording medium is a portable medium such as a flexible disk, an optical disk, a magneto-optical disk, and a semiconductor memory.

Although the present invention has been described above with reference to the exemplary embodiments, the present invention is not limited to the exemplary embodiments. The configurations and details of the present invention can be changed in various manners that can be understood by one skilled in the art within the scope of the present invention.

1 server device
2 HW
21 FW check target memory
22 FW check nontarget memory
23 nonvolatile memory
3 FW
31 POST processing unit
32 ACPI information
41 boot loader
42 kernel image writer
43 kernel image loader
5 OS
51 memory check unit
52 memory configuration information table
53 memory configuration information table (for comparison)
54 memory page management table
55 AP startup unit
56 AP startup condition table
6 server device
7 HW
74 data-dedicated nonvolatile memory
8 OS
81 memory check unit
87 AP recovery unit
88 AP recovery procedure table
9 information processing device
91 startup check unit
92 operating system
921 memory check unit
922 application startup unit

The invention claimed is:

1. An information processing device comprising:
a startup check unit configured to check for a predetermined range of memory area, the information processing device starting an operating system by using the memory area checked by the startup check unit, the operating system having at least one memory check unit configured to check for another memory area other than the memory area checked by the startup check unit, and an application startup unit configured to start an application depending on a memory amount indicating an amount of the other memory area checked by the memory check unit; and
a kernel image writing part configured to store an execution memory image of a kernel into another storage device before power-off,
wherein, after the operating system performs cleanup of a memory so that the execution memory image is held in the memory area to be checked by the startup check unit, the kernel image writing part stores the execution memory image into the other storage device.

2. The information processing device according to claim 1, wherein the application startup unit is configured to start the application when it is determined that the memory amount indicating the amount of the other memory area checked by the memory check unit is more than a memory amount needed to start the application.

3. The information processing device according to claim 1, wherein the application startup unit has condition information showing a condition necessary for startup for each application and is configured to start the application based on the condition information and the memory amount indicating the amount of the other memory area checked by the memory check unit.

4. The information processing device according to claim 3, wherein:
the condition information includes information showing a startup order of applications, and
the application startup unit is configured to start the application in accordance with the startup order shown by the condition information.

5. The information processing device according to claim 1, wherein the application startup unit is configured to notify another information processing device that an application cannot be executed when it is determined that the other memory area for starting the application is insufficient as a result of checking by the memory check unit.

6. The information processing device according to claim 1, further comprising a plurality of memory check units, wherein the other memory area is checked by the plurality of memory check units in parallel.

7. An information processing method comprising:
checking for a predetermined range of memory area;
starting an operating system by using the checked memory area, the operating system being configured to check for another memory area other than the checked memory area of a whole memory area, and start an application depending on a memory amount indicating an amount of the checked memory area; and
storing an execution memory image of a kernel into another storage device before power-off, the execution memory image being stored into the other storage device after the operating system performs cleanup of a memory so that the execution memory image is held in the memory area to be checked by the startup check unit.

8. A non-transitory computer-readable medium storing a program comprising instructions for:
    causing an information processing device to realize a startup check unit configured to check for a predetermined range of memory area;
    causing the information processing device to start an operating system by using the memory area checked by the startup check unit;
    causing the operating system to realize a memory check unit configured to check for another memory area other than the memory area checked by the startup check unit of a whole memory area, and an application startup unit configured to start an application depending on a memory amount indicating an amount of the other memory area checked by the memory check unit; and
    causing the information processing device to realize a kernel image writing part configured to store an execution memory image of a kernel into another storage device before power-off, the execution memory image being stored into the other storage device after the operating system performs cleanup of a memory so that the execution memory image is held in the memory area to be checked by the startup check unit.

9. The non-transitory computer-readable medium storing the program according to claim 8, wherein:
    the memory check unit is configured to check for a memory area other than a memory area checked by the startup check unit and also obtain check progress status information showing whether checking is already done or not for each predetermined range of the memory area, and
    the application startup unit is configured to start the application when it is determined that the memory amount indicating the amount of the other memory area checked by the memory check unit is more than a memory amount needed to start the application based on the check progress status information.

* * * * *